United States Patent
Lin (10) Patent No.: US 12,310,007 B2
(45) Date of Patent: May 20, 2025

(54) SEMICONDUCTOR STRUCTURE AND FABRICATION METHOD THEREOF

(71) Applicant: CHANGXIN MEMORY TECHNOLOGIES, INC., Hefei (CN)

(72) Inventor: Chao Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 363 days.

(21) Appl. No.: 17/945,113

(22) Filed: Sep. 15, 2022

(65) Prior Publication Data

US 2023/0013735 A1 Jan. 19, 2023

(30) Foreign Application Priority Data

Jun. 16, 2022 (CN) .......................... 202210680638.9

(51) Int. Cl.
*H10B 12/00* (2023.01)
(52) U.S. Cl.
CPC ........... *H10B 12/50* (2023.02); *H10B 12/053* (2023.02); *H10B 12/34* (2023.02); *H10B 12/482* (2023.02)
(58) Field of Classification Search
CPC ...... H10B 12/50; H10B 12/053; H10B 12/34; H10B 12/482; H10B 12/30; H10B 12/09; H01L 23/535; H01L 21/76895
USPC ........................................................... 257/4
See application file for complete search history.

(56) References Cited

U.S. PATENT DOCUMENTS

| | | | |
|---|---|---|---|
| 6,261,908 B1* | 7/2001 | Hause | H01L 23/535 257/E21.59 |
| 2012/0108048 A1* | 5/2012 | Lim | H10B 43/27 438/585 |
| 2019/0252386 A1* | 8/2019 | Lee | H01L 23/528 |
| 2023/0298931 A1* | 9/2023 | Zhang | H01L 21/76898 438/696 |

FOREIGN PATENT DOCUMENTS

CN 110164867 A 8/2019

* cited by examiner

*Primary Examiner* — Kimberly N Rizkallah
*Assistant Examiner* — Nicholas B Michaud
(74) *Attorney, Agent, or Firm* — Kilpatrick Townsend & Stockton LLP (57) ABSTRACT

Embodiments relate to a semiconductor structure and a fabrication method thereof. The semiconductor structure has an array region and a peripheral region, and includes: a semiconductor substrate; a memory array structure positioned above the semiconductor substrate in the array region; a peripheral circuit structure positioned above the semiconductor substrate in the peripheral region; and a conductive connection structure positioned in the semiconductor substrate to electrically connect the memory array structure and the peripheral circuit structure. The semiconductor structure and the fabrication method thereof can effectively improve performance of a memory device.

13 Claims, 7 Drawing Sheets

SEMICONDUCTOR STRUCTURE AND FABRICATION METHOD THEREOF

CROSS-REFERENCE TO RELATED APPLICATION

This application claims priority to Chinese Patent Application No. 202210680638.9, titled "SEMICONDUCTOR STRUCTURE AND FABRICATION METHOD THEREOF" and filed to the State Patent Intellectual Property Office on Jun. 16, 2022, the entire contents of which are incorporated herein by reference.

TECHNICAL FIELD

The present disclosure relates to the field of semiconductor technology, and more particularly, to a semiconductor structure and a fabrication method thereof.

BACKGROUND

A semiconductor memory device generally includes an array region and a peripheral region. The array region is provided with a memory array structure, and the peripheral region is provided with a peripheral circuit structure. The peripheral circuit structure can control each memory cell in the memory array structure.

In an existing memory device, after the memory array structure is formed, a dielectric layer is etched downward from above the memory array structure to form contact hole structures, and then conductive layers are formed above the contact hole structures to connect related contact hole structures, to implement electrical connection between the memory array structure and the peripheral circuit structure.

However, this connection manner may adversely affect device performance in some cases. For example, for a three-dimensional memory device, its multi-layer stack structure may lead to longer contact hole structures, which may result in a larger RC delay.

SUMMARY

On this basis, embodiments of the present disclosure provide a semiconductor structure and a fabrication method thereof.

A semiconductor structure has an array region and a peripheral region, and the semiconductor structure includes: a semiconductor substrate; a memory array structure positioned above the semiconductor substrate in the array region; a peripheral circuit structure positioned above the semiconductor substrate in the peripheral region; and a conductive connection structure positioned in the semiconductor substrate, the conductive connection structure being configured to electrically connect the memory array structure and the peripheral circuit structure.

A method for fabricating a semiconductor structure is provided, the semiconductor structure includes an array region and a peripheral region, and the method includes: providing a semiconductor substrate; forming a conductive connection structure in the semiconductor substrate; forming a peripheral circuit structure above the semiconductor substrate in the peripheral region, and electrically connecting the peripheral circuit structure to the conductive connection structure; and forming a memory array structure above the semiconductor substrate in the array region, and electrically connecting the memory array structure to the conductive connection structure.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

Reference numerals in the accompanying drawings:
100—semiconductor substrate, 100a—trench, 200—conductive connection structure, 300—peripheral circuit structure, 400—memory array structure, 500—isolation protection layer, 510—first oxide layer, 520—nitride layer, 530—second oxide layer, 600—filling layer, 710—first dielectric layer, 710a—first interconnection hole, 710b—second interconnection hole, 720—second dielectric layer, 730—third dielectric layer, 800—connection line structure, 810—conductive plug, 820—connection conductive layer, 900—bit line, 900a—bit line hole, 10—second patterned photoresist layer, 20—third patterned photoresist layer, and 30—fourth patterned photoresist layer.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Therefore, without departing from the teachings of the present disclosure, a first element, component, region, layer, doping type, or section discussed below may be represented as a second element, component, region, layer, doping type, or section.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should also be understood that the terms "comprising" and/or "including", when used in this specification, may determine the presence of the described features, integers, steps, operations, elements and/or components, but do not preclude the presence or addition of one or more other features, integers, steps, operations, elements, components, and/or groups thereof. Meanwhile, as used herein, the term "and/or" includes any and all combinations of related listed items.

It should be noted that the "connection" in the following embodiments should be understood as "electrical connection" and the like if there is an electrical signal between objects to be connected.

Figure 1:
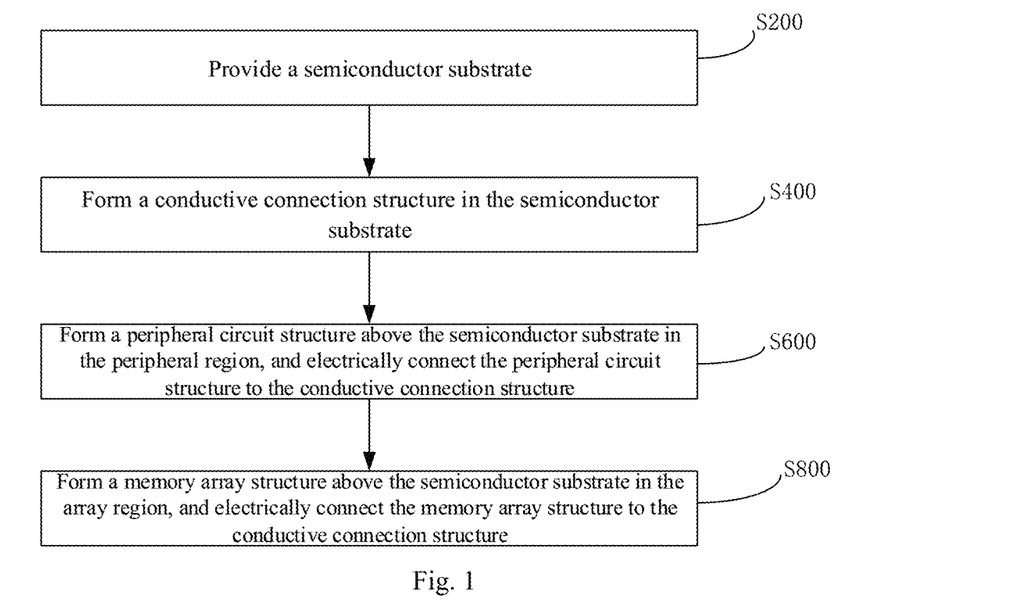
FIG. 1 illustrates a flowchart of a method for fabricating a semiconductor structure provided in an embodiment.
Figure 16:
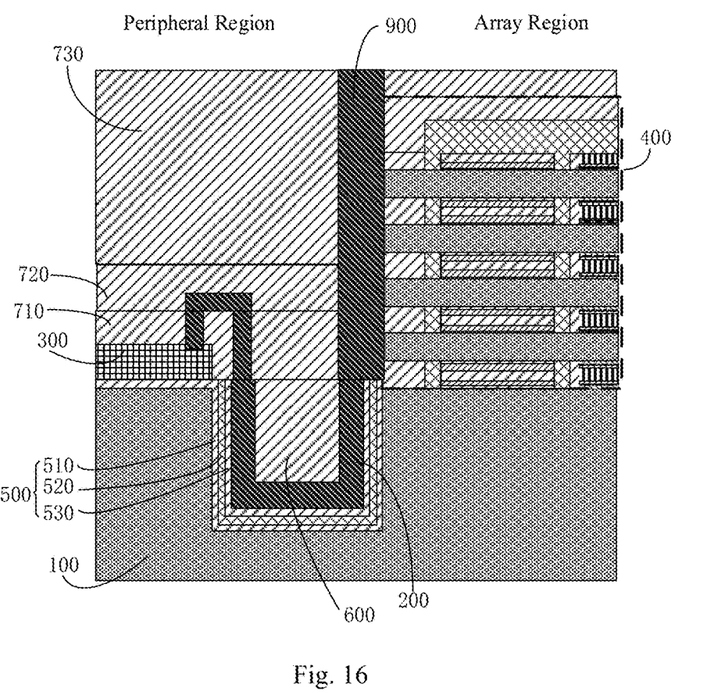
FIG. 16 illustrates a schematic structural diagram of the semiconductor structure provided in an embodiment.

In one embodiment, referring to FIG. 1, there is provided a method for fabricating a semiconductor structure. Referring to FIG. 16, the semiconductor structure includes an array region and a peripheral region. The method for fabricating the semiconductor structure includes following steps: Step S200, providing a semiconductor substrate 100; Step S400, referring to FIG. 6, forming a conductive connection structure 200 in the semiconductor substrate 100; Step S600, referring to FIG. 10, forming a peripheral circuit structure 300 above the semiconductor substrate 100 in the peripheral region, and electrically connecting the peripheral circuit structure 300 to the conductive connection structure 200; and Step S800, referring to FIG. 16, forming a memory array structure 400 above the semiconductor substrate 100 in the array region, and electrically connecting the memory array structure 400 to the conductive connection structure 200.

In Step S200, a material of the semiconductor substrate 100 may include, but is not limited to, silicon, germanium, silicon germanium, gallium nitride, gallium arsenide, indium arsenide, indium gallium arsenide, silicon carbide, and the like.

In Step S400, a material of the conductive connection structure 200 may include, but is not limited to, metals (e.g., tungsten, molybdenum), metal nitrides (e.g., titanium nitride), metal silicides (e.g., cobalt silicide), and the like. Furthermore, the conductive connection structure 200 may be a single-layer structure or a multi-layer structure.

Figure 6:
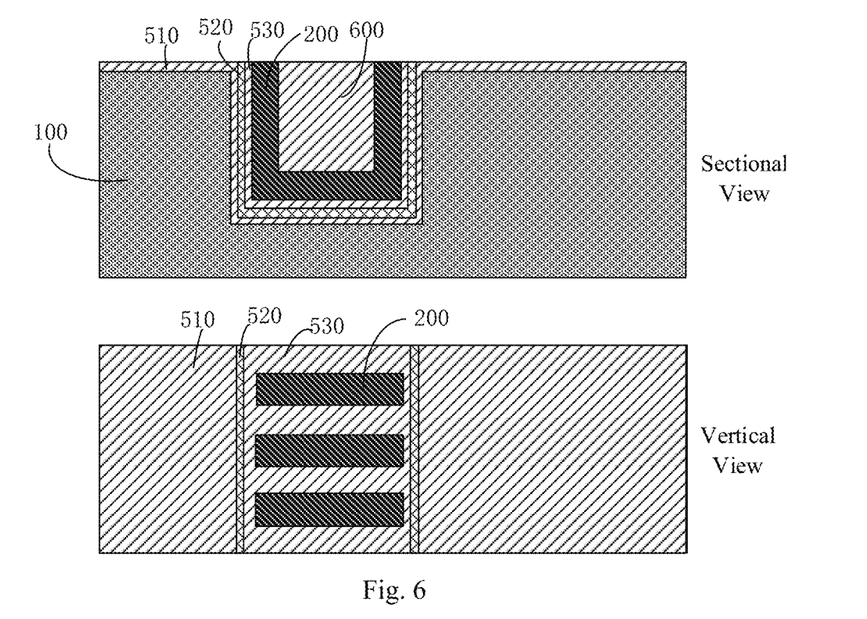

Referring to FIG. 6, the conductive connection structure 200 is formed in the semiconductor substrate 100, that is, the conductive connection structure 200 is embedded in the semiconductor substrate 100.

In Step S600, the peripheral circuit structure 300 may be formed through a plurality of process steps. In FIGS. 7 to 16, for the sake of figure clarity, a concrete structure of the peripheral circuit structure 300 is not shown.

The peripheral circuit structure 300 may include a logic circuit formed of a metal layer. The logic circuit can control a memory array. Also, the peripheral circuit structure 300 may further include a peripheral dielectric layer. The peripheral dielectric layer may perform insulation isolation on a part where no circuit is formed, and may wrap the peripheral circuit structure to protect it. In some embodiments, the peripheral dielectric layer may include a plurality of dielectric layers formed by a plurality of process steps.

The peripheral circuit structure 300 is electrically connected to the conductive connection structure 200. In some embodiments, the conductive connection structure 200 may be electrically connected to the logic circuit formed of the metal layer of the peripheral circuit structure 300. The electrical connection here may be a direct connection or an electrical connection through other conductive structures, which is not limited here.

In Step S800, the memory array structure 400 may be formed through a plurality of related process steps.

As an example, referring to FIGS. 13 to 16, the memory array structure 400 may have a three-dimensional structure, and may include a plurality of memory cells arranged in a stack. Each of the memory cells includes a transistor 410 and a memory element 420. The transistors may include, for example, gate-all-around (GAA) transistors, thereby increasing device integration. The memory element may include, for example, a capacitor.

It is worth noting that the memory array structure 400 here is not limited to the memory array structure 400 having the three-dimensional structure, for example, it may also have a two-dimensional structure. The transistor is not limited to be the GAA transistor, for example, its gate may be in contact with only a side of a semiconductor layer. The memory element is also not limited to the capacitor, for example, it may also be a magnetic tunnel junction.

The memory array structure 400 may be electrically connected to the conductive connection structure 200 through structures such as bit lines or word lines. The structures such as the bit lines or the word lines may be directly connected to the conductive connection structure 20, or may be electrically connected to the conductive connection structure 200 through other conductive structures, which is not limited herein.

In this embodiment, by forming the conductive connection structure 200 in the semiconductor substrate 100, it is avoidable forming a contact hole structure by punching holes from above the memory array structure 400, thereby effectively ensuring device performance. When the memory array structure 400 has the three-dimensional structure, because the conductive connection structure 200 is positioned in the semiconductor substrate 100, higher contact hole structures may be formed without restriction by the multi-layer stack structure of the memory array structure 400. In this case, a resistance between the memory array structure and the peripheral circuit structure can be effectively reduced, thereby effectively improving RC delay.

In one embodiment, the Step S400 includes: Step S410, referring to FIG. 2, forming a trench 100a in the semiconductor substrate 100; and Step S420, referring to FIG. 6, forming the conductive connection structure 200 in the trench 100*a*.

Figure 2:
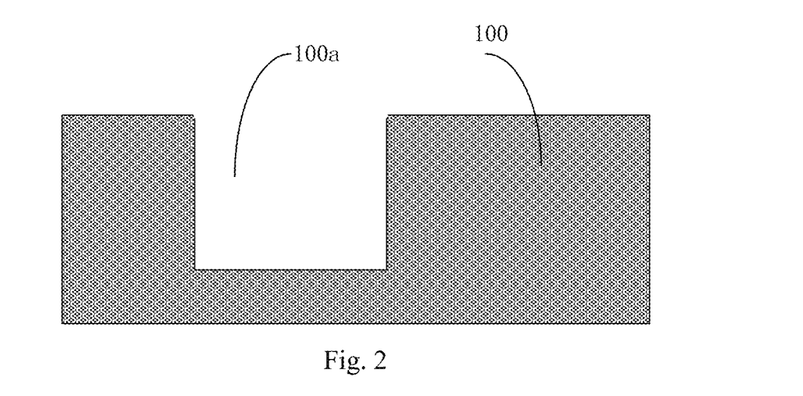
FIGS. 2 to 15 illustrate a schematic structural diagram in a process of fabricating the semiconductor structure provided in an embodiment.

In Step S410, a first patterned photoresist layer may be formed on the semiconductor substrate 100 first through a photolithography process, and an opening region of the first patterned photoresist layer defines a position of the trench 100*a*. Next, the original semiconductor substrate 100 may be etched based on the first patterned photoresist layer to form the trench 100*a*, and then the first patterned photoresist layer is removed. Dry etching may be selected for the etching, such that a size and a shape of the trench 100*a* may be better controlled. Of course, wet etching may also be selected, which is not limited here.

A depth of the trench 100*a* may be set according to actual requirements, for example, the depth may be set to be greater than 5,000 Å.

Meanwhile, as an example, a plurality of trenches 100*a* arranged in parallel may be provided in the semiconductor substrate 100. Number of the trenches 100*a* may be equal to that of the bit lines connected to the memory array structure 400.

In Step S420, the conductive connection structure 200 may be formed in the trench 100*a* by means of chemical vapor deposition or the like.

Referring to FIG. 6, when the plurality of trenches 100*a* arranged in parallel are provided in the semiconductor substrate 100, the conductive connection structure 200 is formed in each of the trenches, such that a plurality of conductive connection structures 200 arranged in parallel may be formed.

In this embodiment, by forming the trench 100*a* in the semiconductor substrate 100*a*, the conductive connection structure 200 is formed in the trench 100*a*, such that the conductive connection structure 200 is effectively embedded in the semiconductor substrate 100.

Of course, in some embodiments, the conductive connection structure 200 may also extend from inside the trench 100*a* to above a portion of the semiconductor substrate outside the trench.

In one embodiment, the trench 100*a* is positioned between the array region and the peripheral region, such that the conductive connection structure 200 may electrically connect the peripheral circuit structure 300 and the memory array structure 400 respectively at two opposite ends thereof, which may minimize the resistance between the peripheral circuit structure 300 and the memory array structure 400.

Of course, in other embodiments, the trenches 100*a* may also be positioned closer to the array region and the peripheral region, but not between the array region and the peripheral region, which is not limited here.

In one embodiment, before Step S400, the method further includes: Step S300, forming an isolation protection layer on a surface of the trench 100*a*.

The formation of the isolation protection layer can effectively insulate and isolate the conductive connection structure 200 in the trench 100*a* from the semiconductor substrate 100, thereby effectively preventing occurrence of electric leakage between the conductive connection structure 200 and the semiconductor substrate 100.

Meanwhile, when there are a plurality of trenches 100*a*, the conductive connection structures 200 in each trench 100*a* may be effectively insulated and isolated, to prevent occurrence of electric leakage or coupling between the conductive connection structures 200 in each trench 100*a*, thereby preventing occurrence of mutual signal interference between the conductive connection structures 200 in each trench 100*a*.

In one embodiment, Step S300 includes: Step S310, forming an isolation protection material layer on a surface of the trench 100*a* and an upper surface of the semiconductor substrate 100, where the isolation protection material layer includes a first oxide layer 510, a nitride layer 520 and a second oxide layer 530 formed in sequence, and the second oxide layer 530 fills up the trench 100*a*; Step S320, referring to FIG. 3, performing chemical mechanical polishing on the isolation protection material layer, where the chemical mechanical polishing stops on the first oxide layer 510; and Step S330, referring to FIG. 4 and FIG. 5, patterning the second oxide layer 530 processed after chemical mechanical polishing.

In Step S310, the first oxide layer 510 and the second oxide layer 530 may be silicon dioxide, for example. The nitride layer 520 may be, for example, silicon nitride.

The first oxide layer 510 may be formed by thermally oxidizing the surface of the trench 100*a* and the upper surface of the semiconductor substrate 100 by means of thermal oxidation. Next, the nitride layer 520 is deposited on a surface of the first oxide layer 510 by means of atomic layer deposition. Next, the second oxide layer 530 is deposited on a surface of the nitride layer 520 by means of high density plasma enhanced chemical vapor deposition (HDP-CVD).

After the second oxide layer 530 is deposited, the trench 100*a* may be filled up.

Figure 3:
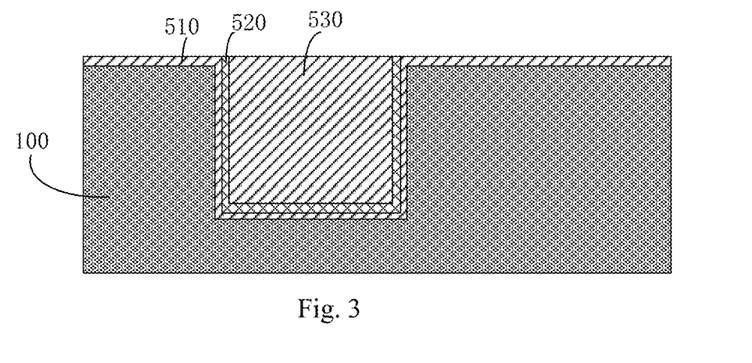

In Step S320, referring to FIG. 3, the chemical mechanical polishing is stopped on the first oxide layer 510, such that a remaining part of first oxide layer 510 exists on both the surface of the trench 100*a* and the upper surface of the semiconductor substrate 100, to protect the upper surface of the semiconductor substrate 100 during the subsequent processing. Of course, in some embodiments, the first oxide layer 510 on the upper surface of the semiconductor substrate 100 outside the trench 100*a* may be removed.

Figure 4:
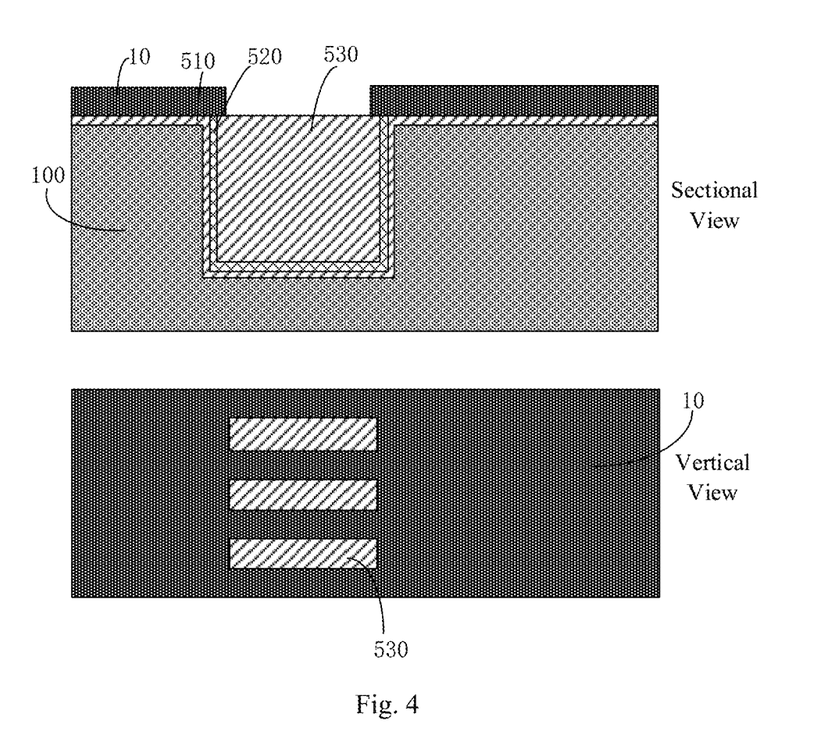
Figure 5:
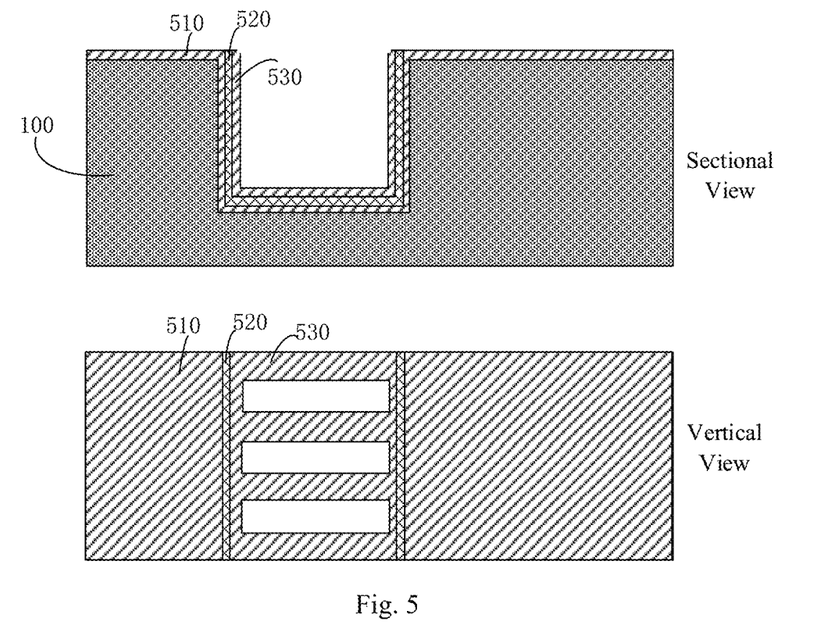

In Step S330, referring to FIG. 4, a second patterned photoresist layer 10 may be first formed on a surface of a structure formed after the chemical mechanical polishing. The second patterned photoresist layer 10 covers an edge portion of the second oxide layer 530 and exposes a middle portion of the second oxide layer 530. Next, referring to FIG. 5, based on the second patterned photoresist layer 10, a part of the second oxide layer 530 is etched and removed, such that the trench 100*a* may have a space for forming the conductive connection structure 200. A remaining part of the second oxide layer 530 covers the surface of the nitride layer 520, and a thickness of the second oxide layer 530 remained may be 10 nm to 30 nm. Next, the second patterned photoresist layer 10 is removed.

Next, referring to FIG. 6, in Step S400, the conductive connection structure 200 may be formed on the surface of the second oxide layer 530 by means of atomic layer deposition (ALD). In some embodiments, a conductive connection material layer may be deposited first, and then chemical mechanical polishing is performed on the conductive connection material layer. The chemical mechanical polishing stops on the first oxide layer 510, and a remaining part of the conductive connection material layer constitutes the conductive connection structure 200. At this moment, the upper surface of the conductive connection structure 200 may be flush with that of the first oxide layer 510.

Isolation formed in this embodiment includes the first oxide layer 510, the nitride layer 520, and the second oxide layer 530. The first oxide layer 510, the nitride layer 520 and the second oxide layer 530 form an ONO multi-layer composite structure, which has the characteristics of higher relative dielectric constant, higher breakdown voltage, lower electric leakage, etc., thereby effectively improving device reliability.

Of course, in other embodiments, the isolation protection layer may also be a single-layer insulation structure, which is not limited here.

In one embodiment, after Step S400, the trench 100a may not be filled up.

At this moment, after Step S400, the method also includes: Step S500, referring to FIG. 6, forming a filling layer 600 in the trench 100a.

The trench 100a may be well filled by means of high density plasma enhanced chemical vapor deposition (HDP-CVD), etc., to form the filling layer 600.

The filling layer 600 may include, but is not limited to, a silicon oxide layer, a silicon nitride layer, a silicon oxynitride layer, and the like.

In some embodiments, a filling material layer may be deposited on the surface of the previously formed structure by means of HDP-CVD or the like. Next, chemical mechanical polishing is performed, the chemical mechanical polishing is stopped on the conductive connection structure 200 formed in the trench 100a, and a remaining part of the filling material layer constitutes the filling layer 600. At this moment, the top surface of the filling layer 600, the top surface of the conductive connection structure 200 and the top surface of the first oxide layer 510 are flush.

At this moment, the conductive connection structure 200 in the trench 100a is shaped like a "U", which can effectively save material costs of the conductive connection structure 200. A thickness of the conductive connection structure 200 may be set according to actual resistance requirements, and the greater the thickness is, the smaller the resistance value is.

Of course, in some embodiments, in Step S400, the trench 100a may also be filled up by means of the conductive connection structure 200, and in this case, the conductive connection structure 200 may have a lower resistance.

In one embodiment, Step S600 includes: Step S610, referring to FIG. 7, forming the peripheral circuit structure 300 on the semiconductor substrate 100a in the peripheral region; Step S620, with continued reference to FIG. 7, forming a first dielectric layer 710 in the peripheral region and the array region, where the first dielectric layer 710 covers the peripheral circuit structure 300; Step S630, referring to FIG. 8, forming a first interconnection hole 710a and a second interconnection hole 710b in the first dielectric layer 710, where the first interconnection hole 710a is communicated to the peripheral circuit structure 300, and the second interconnection hole 710b is communicated to the conductive connection structure 200; Step S640, referring to FIG. 9 and FIG. 10, a connection line structure 800 is formed on the first dielectric layer 710, where the connection line structure 800 is electrically connected to the peripheral circuit structure 300 and the conductive connection structure 200 through the first interconnection hole 710a and the second interconnection hole 710b.

Figure 7:
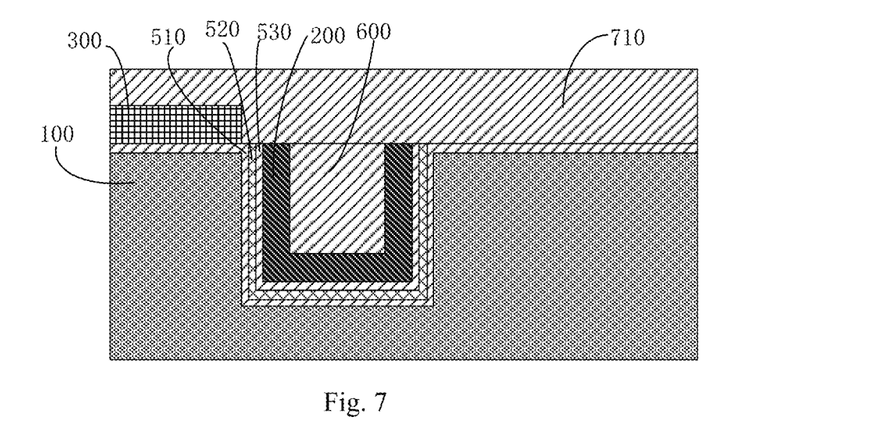

In Step S610, referring to FIG. 7, as described above, the peripheral circuit structure 300 may include a peripheral dielectric layer and a logic circuit (not shown) formed by a metal layer. Both the peripheral dielectric layer and the logic circuit may be formed through a plurality of process steps, and the process steps for forming the peripheral dielectric layer and the logic circuit may have intersections.

In Step S620, with continued reference to FIG. 7, a first dielectric material layer covering the peripheral circuit structure 300 may be formed first. Next, the first dielectric material layer is planarized. For example, the first dielectric material layer may be planarized by means of chemical mechanical polishing to form the first dielectric layer 710.

A material of the first dielectric layer 710 may include, but is not limited to, a silicon oxide layer, a silicon nitride layer, a silicon oxynitride layer, and the like.

Figure 8:
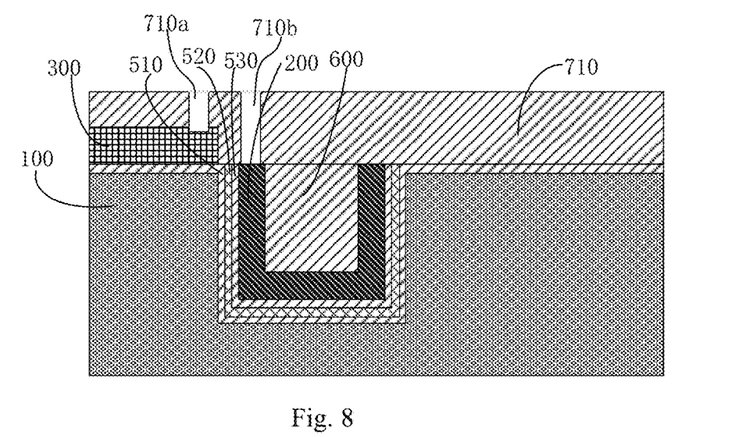

In Step S630, referring to FIG. 8, the first interconnection hole 710a and the second interconnection hole 710b may be formed in the first dielectric layer 710 through photolithography and etching processes. The first interconnection hole 710a is communicated to a circuit of the peripheral circuit structure 300. The second interconnection hole 710b may be communicated to a portion of the conductive connection structure 200 close to the peripheral region.

Figure 9:
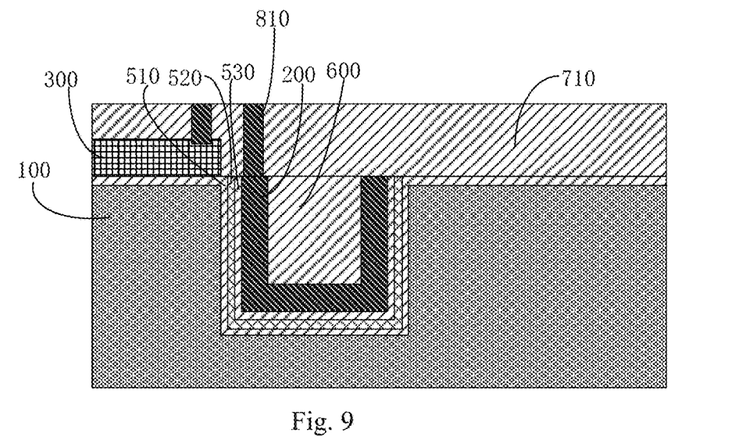

In Step S640, referring to FIG. 9, a conductive material (e.g., metal) may be deposited first, and a conductive plug 810 is formed in the first interconnection hole 710a and the second interconnection hole 710b. Next, referring to FIG. 10, a connection conductive layer 820 covering the first interconnection hole 710a and the second interconnection hole 710b is formed on the first dielectric layer 710, to form a connection line structure 800. In this case, the connection line structure 800 includes the connection conductive layer 820 and the conductive plug 810 in the first interconnection hole 710a and the second interconnection hole 710b. A material of the conductive plug 810, a material of the connection conductive layer 820 and a material of the conductive connection structure 200 may be the same or may be different.

In some embodiments, after a conductive material is deposited and fills up the first interconnection hole 710a and the second interconnection hole 710b and goes beyond the first interconnection hole 710a and the second interconnection hole 710b, the conductive material may be patterned, thereby forming the connection line structure 800 having an integrated structure.

In this embodiment, arrangement of the connection line structure 800 may facilitate the electrical connection between the peripheral circuit structure 300 and the conductive connection structure 200.

In one embodiment, after Step S640, the method also includes: Step S710, referring to FIG. 10, forming a second dielectric layer 720 on the upper surface of the first dielectric layer 710 and the upper surface of the connection line structure 800; and Step S720, referring to FIG. 11 and FIG. 12, patterning the first dielectric layer 710 and the second dielectric layer 720 to expose the semiconductor substrate 100 in the array region.

Figure 10:
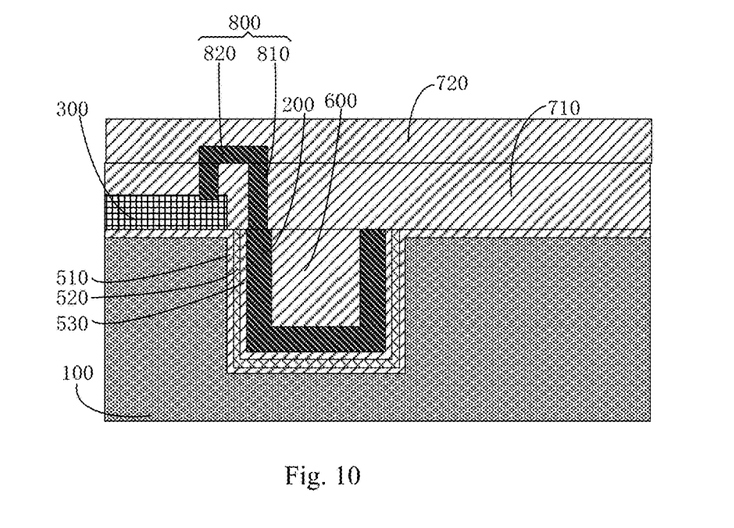

In Step S710, referring to FIG. 10, a material of the second dielectric layer 720 may include, but not limited to, a silicon oxide layer, a silicon nitride layer, a silicon oxynitride layer, and the like. The material of the second dielectric layer 720 and the material of the first dielectric layer 710 may be the same or may be different, which is not limited herein.

The formation of the second dielectric layer 720 can effectively protect the conductive connection structure 200 and the peripheral circuit structure 300 in the subsequent process of forming the memory array structure 400.

Figure 11:
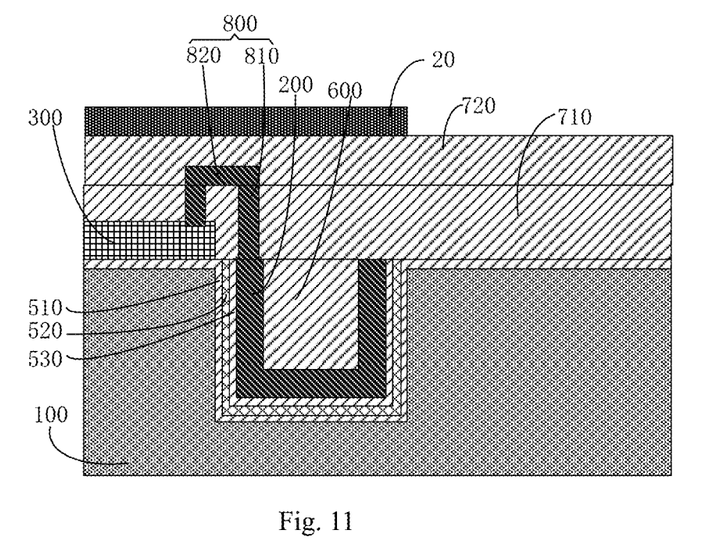
Figure 12:
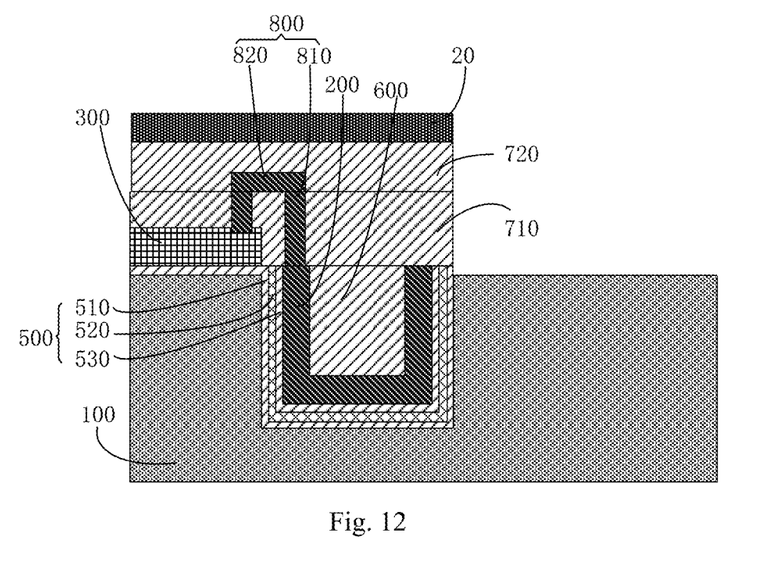

In Step S720, referring to FIG. 11, a third patterned photoresist layer 20 may be first formed on the second dielectric layer 720. Next, referring to FIG. 12, based on the third patterned photoresist layer 20, a portion of the first dielectric layer 710 and a portion of the second dielectric layer 720 positioned in the array region are removed, such that the semiconductor substrate 100 in the array region is exposed. It is to be understood that, in this case, if the surface of the semiconductor substrate 100 has the first oxide layer 510, a portion of the first oxide layer 510 in the array region is also removed, and the final first oxide layer 510 extends from the trench to the upper surface of the semiconductor substrate 100 in the peripheral region. Next, the third patterned photoresist layer 20 is removed.

Exposing the semiconductor substrate 100 in the array region may facilitate the formation of the memory array structure 400. In some embodiments, after Step S800, the method may include: Step S810, referring to FIG. 13, forming the memory array structure on the semiconductor substrate 100 exposed in the array region; Step S820, referring to FIG. 14, forming a third dielectric layer 730 on the memory array structure 400 and the second dielectric layer 720; Step S830, referring to FIG. 15, forming a bit line hole 900a penetrating through the third dielectric layer 730, the second dielectric layer 720 and the first dielectric layer 710, where the bit line hole 900a is communicated to the conductive connection structure 200 and a source region or drain region of a transistor of the memory cell in each layer; and Step S840, referring to FIG. 16, forming a bit line 900 in the bit line hole 900a.

Figure 13:
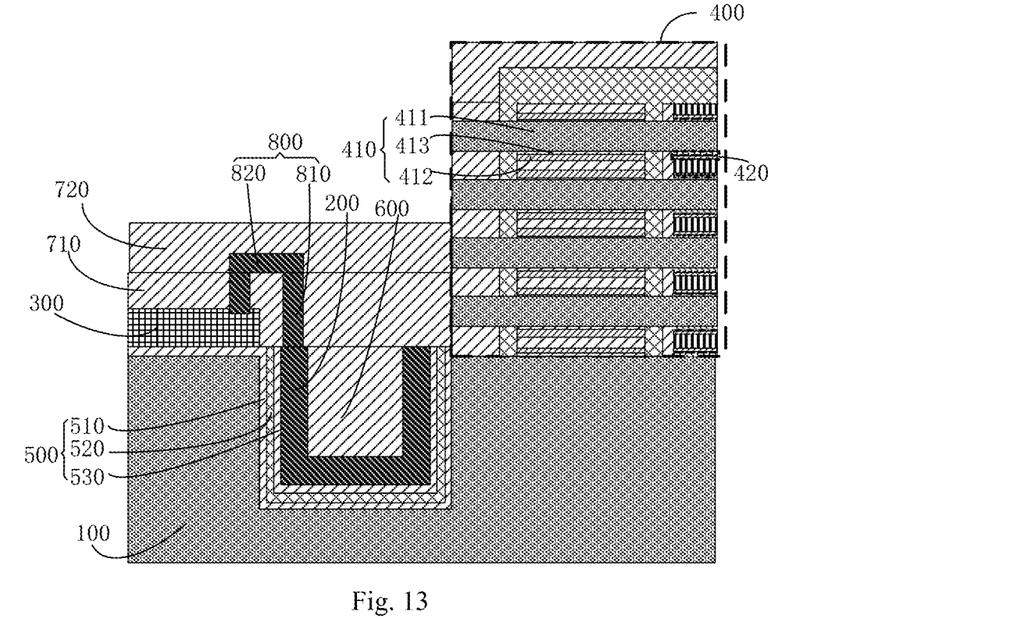

In Step S810, referring to FIG. 13, the memory array structure 400 may be formed through a plurality of process steps. The memory array structure 400 may include a plurality of memory cells arranged in a stack. Each of the memory cells includes a transistor 410 and a memory element 420. The transistor may include a lateral gate-all-around (GAA) transistor, where the transistor may include a semiconductor layer 411, a gate 412 and a gate dielectric layer 413, and two ends of the semiconductor layer 410 respectively form a source region and a drain region. One of the source region and the drain region is positioned on a side of the array region close to the peripheral region, and other one of the source region and the drain region is positioned on a side of the array region away from the peripheral region. The gate 412 of the transistor surrounds a portion between the source region and the drain region of the semiconductor layer 411. The gate dielectric layer is positioned between the gate 412 and the semiconductor layer 411.

Figure 14:
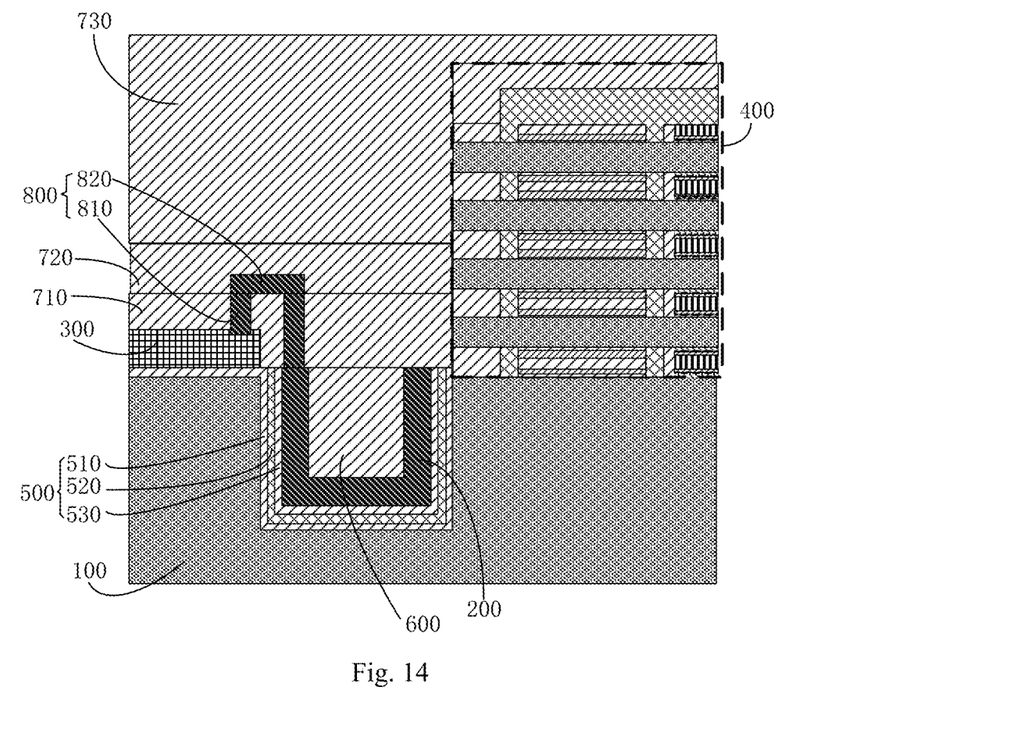

In Step S820, referring to FIG. 14, a material of the third dielectric layer 730 may include, but is not limited to, a silicon oxide layer, a silicon nitride layer, a silicon oxynitride layer, and the like. The material of the third dielectric layer 730, the material of the second dielectric layer 720 and the material of the first dielectric layer 710 may be the same or may be different, which is not limited herein.

The third dielectric layer 730 can effectively protect the memory array structure 400.

Figure 15:
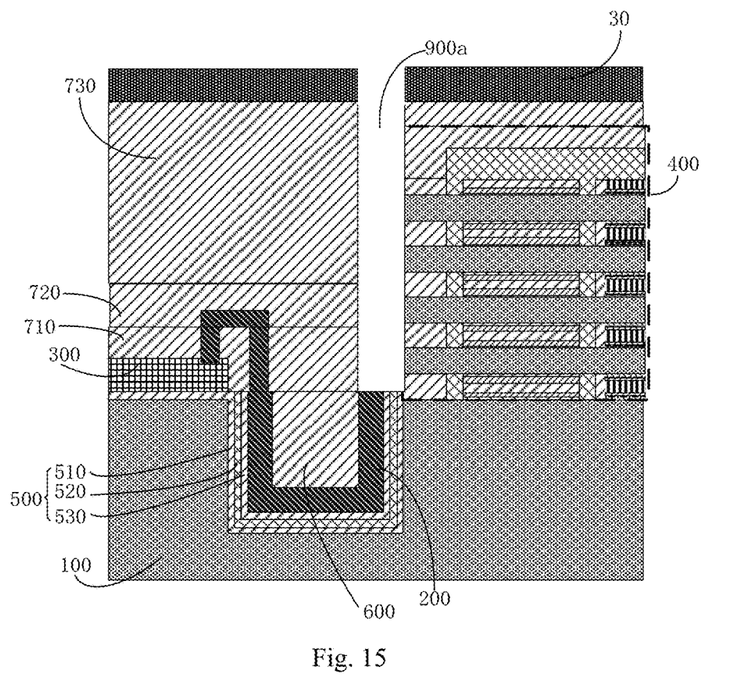

In Step S830, referring to FIG. 15, a fourth patterned photoresist layer 30 may be first formed on the third dielectric layer 730. Next, based on the fourth patterned photoresist layer 30, the third dielectric layer 730, the second dielectric layer 720 and the first dielectric layer 710 are etched, thereby forming the bit line hole 900a. Next, the fourth patterned photoresist layer 30 is removed.

In Step S840, referring to FIG. 16, a bit line material layer may be deposited first, and then chemical mechanical polishing may be performed. The chemical mechanical polishing stops on the third dielectric layer 730, the bit line material layer above the third dielectric layer 730 is removed, and the bit line material layer remained in the bit line hole 900a constitutes the bit line 900.

At this moment, because the bit line hole 900a is communicated to the conductive connection structure 200 and the source region or drain region of the transistor of the memory cell in each layer, the bit line 900 in the bit line hole 900a may be in contact with the conductive connection structure 200 and the source region or drain region of the transistor of the memory cell in each layer, such that the conductive connection structure 200 is electrically connected to the memory array structure.

In this embodiment, the first dielectric layer 710 and the second dielectric layer 720 in the array region are removed, such that a height of the memory array structure 400 may be effectively reduced, and thus the bit lines connecting the memory array structure 400 and the conductive connection structure 200 are shortened. In this case, impedance of the bit lines may be further reduced.

Of course, in other embodiments, the first dielectric layer 710 and/or the second dielectric layer 720 in the array region may not be removed, which is not limited here.

It is to be understood that, in the foregoing embodiments and the accompanying drawings, in most cases a description is made by taking an example where the conductive connection structure 200 is formed in the trench 100a. However, in other embodiments, the conductive connection structure 200 may also be formed in the semiconductor substrate 100a by other means, which is not limited herein. For example, the semiconductor substrate 100a may be heavily doped by means of ion implantation, to form the conductive connection structure 200 in the semiconductor substrate 100a. The conductive connection structure 200 may be formed on a upper surface layer of the semiconductor substrate 100a, or may be completely formed inside the semiconductor substrate 100a and surrounded by the semiconductor substrate 100a. In this case, an isolation protection layer may also be formed around the conductive connection structure 200 through different processes (e.g., ion implantation of oxygen ions and related heat treatment).

It is to be understood that although the steps in the flowchart of FIG. 1 are sequentially displayed as indicated by the arrows, these steps are not necessarily sequentially performed in the order indicated by the arrows. Unless expressly stated herein, the execution of these steps is not strictly restrictive and may be performed in other order. Moreover, at least a part of the steps in FIG. 1 may include a plurality of steps or a plurality of stages, which are not necessarily performed at the same moment, but may be executed at different moments, and the order of execution of these steps or stages is not necessarily performed sequentially, but may be performed alternately or alternately with at least a part of the steps or stages of other steps or other steps.

In one embodiment, referring to FIG. 16, a semiconductor structure is also provided, which has an array region and a peripheral region. The semiconductor structure includes a semiconductor substrate 100, a memory array structure 400, a peripheral circuit structure 300 and a conductive connection structure 200.

The memory array structure 400 is positioned above the semiconductor substrate 100 in the array region.

The peripheral circuit structure 300 is positioned above the semiconductor substrate 100 in the peripheral region.

The conductive connection structure 200 is positioned in the semiconductor substrate 100 and electrically connects the memory array structure 400 and the peripheral circuit structure 300.

In one embodiment, the memory array structure includes a plurality of layers of memory cells arranged in a stack.

In one embodiment, the semiconductor substrate is provided with a trench 100*a*, and the conductive connection structure 200 is positioned in the trench 100*a*.

In one embodiment, the trench 100*a* is positioned between the array region and the peripheral region.

In one embodiment, an isolation protection layer 500 is further provided between the conductive connection structure 200 and the trench 100*a*.

In one embodiment, the isolation protection layer 500 includes a first oxide layer 510, a second oxide layer 530, and a nitride layer 520. The first oxide layer 510 is positioned on the surface of the trench, and the nitride layer 520 is positioned between the first oxide layer 510 and the second oxide layer 530.

In one embodiment, the first oxide layer 510 extends from the trench to the upper surface of the semiconductor substrate 100 in the peripheral region.

In one embodiment, a filling layer 600 is further provided in the trench 100*a*, where the filling layer 600 is positioned on the surface of the conductive connection structure 200 and fills the trench 100*a*.

In one embodiment, the semiconductor structure further includes a connection line structure 800 and a bit line 900. The connection line structure 800 electrically connects the peripheral circuit structure 300 to the conductive connection structure 200. The bit line 900 electrically connects the conductive connection structure 200 and the source region or drain region of the transistor of the memory cell in each layer.

Reference may be made to the above definition of the method for fabricating the semiconductor structure for definition of the semiconductor structure, which is not to be described in detail here.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A semiconductor structure having an array region and a peripheral region, the semiconductor structure comprising:
    a semiconductor substrate;
    a memory array structure positioned above the semiconductor substrate in the array region; wherein the memory array structure comprises memory cells arranged in a multi-layer stack and the memory array structure contacts directly with the semiconductor substrate;
    a peripheral circuit structure positioned above the semiconductor substrate in the peripheral region; and
    a conductive connection structure positioned in the semiconductor substrate, the conductive connection structure being configured to electrically connect the memory array structure and the peripheral circuit structure;
    a first dielectric layer, formed in the peripheral region and the array region, the first dielectric layer covering the peripheral circuit structure;
    a first interconnection hole and a second interconnection hole, formed in the first dielectric layer, the first interconnection hole being communicated to the peripheral circuit structure, and the second interconnection hole being communicated to the conductive connection structure;
    a connection line structure, formed on the first dielectric layer, the connection line structure being configured to electrically connect the peripheral circuit structure to the conductive connection structure through the first interconnection hole and the second interconnection hole, the connection line structure comprises a connection conductive layer positioned above the first dielectric layer and two conductive plugs located in the first interconnection hole and the second interconnection hole;
    a second dielectric layer, formed on an upper surface of the first dielectric layer and an upper surface of the connection line structure;
    a third dielectric layer, formed on the memory array structure and the second dielectric layer;
    a bit line hole, penetrating through the third dielectric layer, the second dielectric layer and the first dielectric layer, wherein the bit line hole is communicated to the conductive connection structure and a source region or drain region of a transistor of the memory cell in each layer; and
    a bit line, formed in the bit line hole.

2. The semiconductor structure according to claim 1, wherein the semiconductor substrate is provided with a trench, and the conductive connection structure is positioned in the trench.

3. The semiconductor structure according to claim 2, wherein the trench is positioned between the array region and the peripheral region.

4. The semiconductor structure according to claim 2, wherein an isolation protection layer is further provided between the conductive connection structure and the trench.

5. The semiconductor structure according to claim 4, wherein the isolation protection layer comprises a first oxide layer, a second oxide layer and a nitride layer, the first oxide layer being positioned on a surface of the trench, and the nitride layer being positioned between the first oxide layer and the second oxide layer.

6. The semiconductor structure according to claim 5, wherein the first oxide layer extends from the trench to an upper surface of the semiconductor substrate in the peripheral region.

7. The semiconductor structure according to claim 2, wherein a filling layer is further provided in the trench, the filling layer being positioned on a surface of the conductive connection structure and filling the trench.

8. A method for fabricating a semiconductor structure, the semiconductor structure comprising an array region and a peripheral region, wherein the memory array structure comprises memory cells arranged in a multi-layer stack;
    wherein the method comprises:
    providing a semiconductor substrate;
    forming a conductive connection structure in the semiconductor substrate;

forming a peripheral circuit structure above the semiconductor substrate in the peripheral region, and electrically connecting the peripheral circuit structure to the conductive connection structure; and forming a memory array structure above the semiconductor substrate in the array region, and electrically connecting the memory array structure to the conductive connection structure;

wherein the forming the peripheral circuit structure above the semiconductor substrate in the peripheral region, and electrically connecting the peripheral circuit structure to the conductive connection structure comprises:

forming the peripheral circuit structure above the semiconductor substrate in the peripheral region;

forming a first dielectric layer in the peripheral region and the array region, the first dielectric layer covering the peripheral circuit structure;

forming a first interconnection hole and a second interconnection hole in the first dielectric layer, the first interconnection hole being communicated to the peripheral circuit structure, and the second interconnection hole being communicated to the conductive connection structure; and forming a connection line structure on the first dielectric layer, the connection line structure being configured to electrically connect the peripheral circuit structure to the conductive connection structure through the first interconnection hole and the second interconnection hole; and wherein after the forming the connection line structure on the first dielectric layer, the method further comprises:

forming a second dielectric layer on an upper surface of the first dielectric layer and an upper surface of the connection line structure; and patterning the first dielectric layer and the second dielectric layer to expose the semiconductor substrate in the array region; and wherein the forming the memory array structure above the semiconductor substrate in the array region, and electrically connecting the memory array structure to the conductive connection structure comprises:

forming the memory array structure above the semiconductor substrate exposed in the array region;

forming a third dielectric layer on the memory array structure and the second dielectric layer;

forming a bit line hole penetrating through the third dielectric layer, the second dielectric layer and the first dielectric layer, wherein the bit line hole is communicated to the conductive connection structure and a source region or drain region of a transistor of the memory cell in each layer; and forming a bit line in the bit line hole.

9. The method for fabricating the semiconductor structure according to claim 8, wherein the forming the conductive connection structure in the semiconductor substrate comprises:

forming a trench in the semiconductor substrate; and forming the conductive connection structure in the trench.

10. The method for fabricating the semiconductor structure according to claim 9, wherein the trench is positioned between the array region and the peripheral region.

11. The method for fabricating the semiconductor structure according to claim 9, wherein before the forming the conductive connection structure in the trench, the method further comprises:

forming an isolation protection layer on a surface of the trench.

12. The method for fabricating the semiconductor structure according to claim 11, wherein the forming the isolation protection layer on the surface of the trench comprises:

forming an isolation protection material layer on a surface of the trench and an upper surface of the semiconductor substrate, the isolation protection material layer comprising a first oxide layer, a nitride layer and a second oxide layer formed in sequence, and the second oxide layer filling up the trench;

performing chemical mechanical polishing on the isolation protection material layer, the chemical mechanical polishing being stopped on the first oxide layer; and patterning the second oxide layer processed after chemical mechanical polishing.

13. The method for fabricating the semiconductor structure according to claim 12, wherein after the forming the conductive connection structure in the trench, the method further comprises:

forming a filling layer in the trench.

* * * * *